United States Patent [19]

Suzuki et al.

[11] Patent Number: 5,194,763

[45] Date of Patent: Mar. 16, 1993

[54] OUTPUT CIRCUIT HAVING LARGE CURRENT DRIVING CAPABILITY WITHOUT PRODUCING UNDESIRABLE VOLTAGE FLUCTUATIONS

[75] Inventors: Kenichi Suzuki; Misao Hagiwara, both of Tokyo, Japan

[73] Assignee: NEC Corporation, Tokyo, Japan

[21] Appl. No.: 622,069

[22] Filed: Dec. 4, 1990

[30] Foreign Application Priority Data

Dec. 8, 1989 [JP] Japan .................................. 1-319871

[51] Int. Cl.[5] .......................................... H03K 17/16
[52] U.S. Cl. .................................... 307/443; 307/451; 307/452
[58] Field of Search ............... 307/443, 451, 452, 481, 307/269, 262; 328/62, 105

[56] References Cited

U.S. PATENT DOCUMENTS

| | | | |
|---|---|---|---|
| 3,947,829 | 3/1976 | Suzuki | 307/452 X |
| 4,567,386 | 1/1986 | Benschop | 307/481 |
| 4,587,445 | 5/1986 | Kanuma | 307/443 |
| 4,680,491 | 7/1987 | Yokouchi et al. | 307/473 X |
| 4,724,340 | 2/1988 | Sood | 307/443 |
| 5,038,056 | 8/1991 | Koide et al. | 307/452 X |
| 5,059,818 | 10/1991 | Witt et al. | 328/63 |

FOREIGN PATENT DOCUMENTS

| | | | |
|---|---|---|---|
| 0004234 | 1/1984 | Japan | 307/451 |
| 0148426 | 8/1984 | Japan | 307/443 |

*Primary Examiner*—Eugene R. LaRoche
*Assistant Examiner*—Son Dinh
*Attorney, Agent, or Firm*—Sughrue, Mion, Zinn, Macpeak & Seas

[57] ABSTRACT

An output circuit comprises a plurality of output units respectively coupled between internal data signal lines and external data signal lines and assigned to respective bit positions, and a supervising circuit controlling the output units for supplying output data bits on the associated external data signal lines in a cascade manner; and each of the output units has a driving circuit operative to drive the associated external data signal line by providing a current path between the associated external data signal line and one of two sources of voltage level, and a control circuit responsive to an output data signal on the associated internal data signal line and allowing the driving circuit to drive the associated second data line, wherein the supervising circuit activates the controlling circuit of each output unit upon confirmation that the controlling circuit of another output unit assigned to the previous bit position has been activated.

13 Claims, 8 Drawing Sheets

OUTPUT CIRCUIT HAVING LARGE CURRENT DRIVING CAPABILITY WITHOUT PRODUCING UNDESIRABLE VOLTAGE FLUCTUATIONS

FIELD OF THE INVENTION

This invention relates to an output circuit and, more particularly, to an output circuit with large current driving capability coupled between an internal data bus system and an output data bus system by way of example.

DESCRIPTION OF THE RELATED ART

Figure 1:
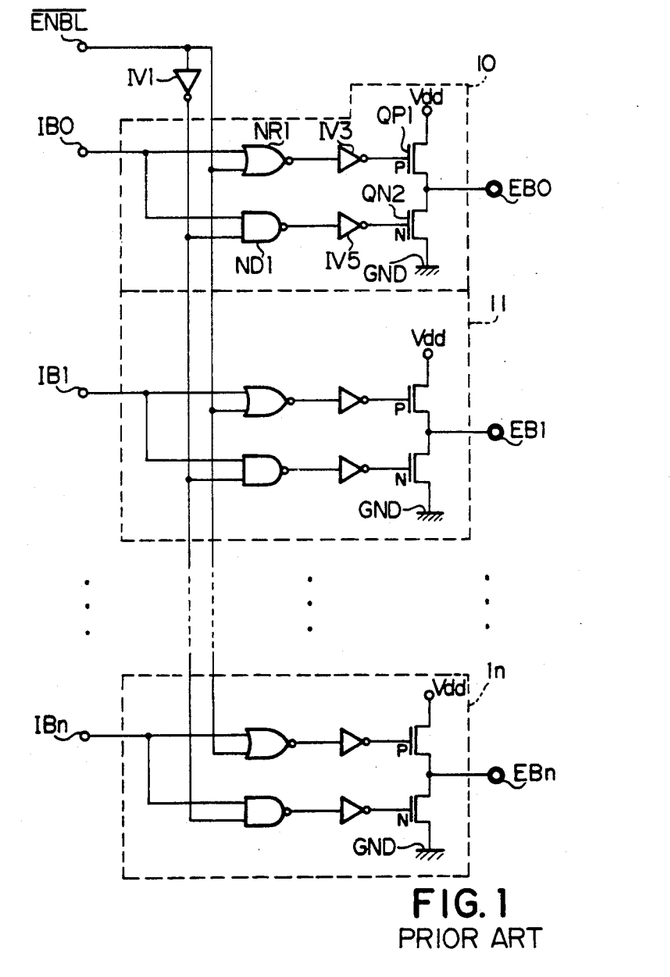
FIG. 1 is a circuit diagram showing the circuit arrangement of the prior art output circuit.

A typical example of the output circuit is illustrated in FIG. 1 of the drawings and comprises a plurality of output units 10, 11, ... and 1n coupled between internal data signal lines IB0, IB1, ... and IBn of an internal data bus system and external data signal lines of an external data bus system, respectively. An output enable signal line $\overline{\text{ENBL}}$ is shared by the output units 10, 11, ... and 1n, and an inverter circuit IV1 is coupled to the output enable signal line for producing a complementary output enable signal. The output enable signal of an active low voltage level and the complementary output enable signal make the output units 10 to 1n responsive to output data bits on the internal data signal lines IB0 to IBn, and the output data bits are transferred from the internal data signal lines IB0 to IBn to the external data signal lines EB0 to EBn, respectively. The output units 10 to 1n are similar in circuit arrangement to one another, and description is hereinbelow made on the output unit 10 only.

The output unit 10 comprises an output inverter circuit consisting of a p-channel type field effect transistor QP1 and an n-channel type field effect transistor QN2 coupled in series between a source of positive voltage level Vdd and a ground node GND, and the external data signal line EB0 is coupled to the common drain node of the field effect transistors QP1 and QN2. The p-channel type field effect transistor QP1 is associated with a series combination of a NOR gate NR1 and an inverter circuit IV3, and the associated internal data signal line IB0 and the output enable signal line $\overline{\text{ENBL}}$ are respectively coupled to two input nodes of the NOR gate NR1. On the other hand, the n-channel type field effect transistor QN2 is associated with a series combination of a NAND gate ND1 and an inverter circuit IV5, and the associated internal data signal line IB0 and the output node of the inverter circuit IV1 are connected to two input nodes of the NAND gate ND1, respectively.

Figure 2:
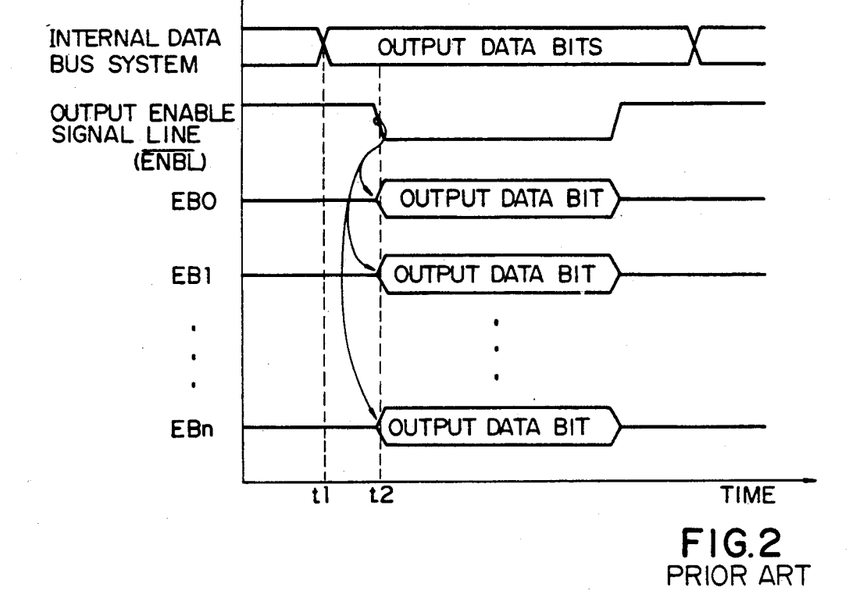
FIG. 2 is a timing chart showing the behavior of the prior art output circuit.

The prior art output circuit thus arranged behaves as follows. Assuming now output data bits take place on the internal data signal lines IB0 to IBn at time t1 as shown in FIG. 2, the output enable signal line $\overline{\text{ENBL}}$ goes down to the active low voltage level at time t2, and, accordingly, the NOR gate NR1 and the NAND gate ND1 of each output unit become responsive to the output data bit on the associated internal data signal line. The NOR gate NR1 and the NAND gate ND1 produce respective output signals both opposite in voltage level to the output data bit supplied thereto, and the two inverter circuits IV3 and IV5 relay the output signals of the opposite voltage level to the p-channel type field effect transistor QP1 and the n-channel type field effect transistor QN2, respectively, Since the p-channel type field effect transistor QP1 and the n-channel type field effect transistor QN2 complementarily turn on and off, a current path is established between either voltage node Vdd or GND and the associated external data signal line EB0, and the output data bit supplied to the output unit is transferred to the associated external data signal line. Since the output enable signal and the complementary output enable signal make all of the output units 10 to 1n simultaneously responsive to the output data bits on the internal data bus system IB0 to IBn, the output units 10 to 1n are concurrently activated at time t2, and, therefore, the output data bits on the external data bus system become valid immediately after time t2 as sill be seen from FIG. 2.

A problem is encountered in the prior art output circuit in that the output units 10 to 1n concurrently activated are causative of undesirable voltage fluctuation at the source of positive voltage level Vdd and/or the ground voltage node GND. This is because of the fact that the output inverter circuits are large in current driving capability allowing a large amount of current to pass upon simultaneous on-states. When the output data bits are logic "1" level equivalent to the positive high voltage level, the source of positive voltage level Vdd supplies a large amount of current through the p-channel type field effect transistors of the output inverter circuits to the external data signal lines EB0 to EBn. This results in undesirable voltage fluctuations at the source of positive voltage level Vdd. The output data bits of logic "0" level equivalent to the ground voltage level cause the output inverter circuits to discharge current from the external data signal lines EB0 to EBn to the ground node GND. Such a concurrent current discharge causes the voltage level at the ground node GND to fluctuate.

Assuming now that parasitic capacitance $C_L$ of about 300 pF is coupled to each external data signal line of an 8-bit external data bus system and that each of the output inverter circuits of the output units 10 to 1n is as large in through-rate (dV/dt) as 4 volts per 10, nanoseconds, the amount of current (i) passing through each output inverter circuit is given as $$i = C_L \times (dV/dt)$$
$$= 300\,pF \times (4/10) = 120 \text{ milliamperes}$$

Thus, the output inverter circuit drives the current of about 120 milliamperes for the associated single data signal line upon activation. The source of positive voltage level Vdd needs to supply 960 milliamperes to the eight-bit external data bus system upon concurrent activation of the eight output units 10 to 1n.

The voltage fluctuations at 960 milliamperes are dependent upon resistance of a power supply network coupled to the source of positive voltage level Vdd and are estimated as follows on the assumption that the resistance is 1, 2, 3, 4 or 5 ohms

TABLE 1

| Resistance | 1 | 2 | 3 | 4 | 5 |
|---|---|---|---|---|---|
| Fluctuations | 0.96 | 1.92 | 2.88 | 3.84 | 4.80 |

Such wide voltage fluctuations decrease the noise margin of signals supplied to or from other electric circuits integrated together with the output circuit, and the signals tend to be inverted to the opposite logic level. The non-intentional inversion misleads the integrated circuit and makes an error in production of the output data bits.

SUMMARY OF THE INVENTION

It is therefore an important object of the present invention to provide an output circuit which does not cause constant voltage sources to fluctuate upon activation thereof.

To accomplish these objects, the present invention proposes to control component output units in a ripple manner.

In accordance with the present invention, there is provided an output circuit comprising a) a plurality of output units coupled between first data signal lines and second data signal lines, respectively, each of the output units comprising a-1) a driving circuit operative to drive the associated second data signal line by providing a current path between the associated second data signal line and one of first and second sources of voltage level, and a-2) a controlling circuit responsive to an output data signal on the associated first data signal line and allowing the driving circuit to drive the associated second data line, in which the output circuit further comprises b) a supervising circuit responsive to an output enable signal and causing the controlling circuit incorporated in one of the output units to allow the driving circuit incorporated in the aforesaid one of the output units to drive the associated second data signal line when the controlling circuit incorporated in another output unit allows the driving circuit incorporated in the aforesaid another output unit to drive the associated second data signal line.

BRIEF DESCRIPTION OF THE DRAWINGS

The features and advantages of an output circuit according to the present invention will be more clearly understood from the following description taken in conjunction with the accompanying drawings in which.

DESCRIPTION OF THE PREFERRED EMBODIMENTS

First Embodiment

Figure 3:
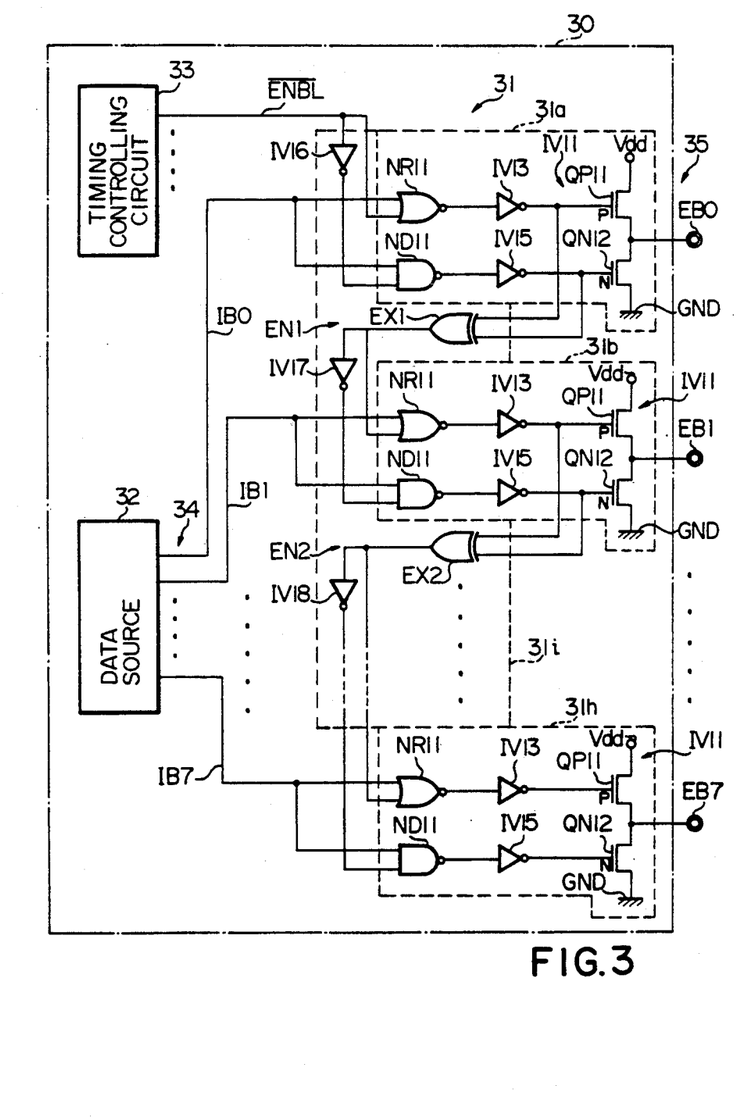
FIG. 3 is a circuit diagram showing the arrangement of an output circuit according to the present invention.

Referring to FIG. 3 of the drawings, an integrated circuit is fabricated on a semiconductor chip 30, and an output circuit 31 embodying the present invention is incorporated in the integrated circuit together with other component circuits including a data source 32 and a timing controlling circuit 33. The output circuit 31 is coupled between an 8-bit internal data bus system 34 and an -8-bit external data bus system 35, and the timing controlling circuit 33 supplies an output enable signal of an active low voltage level equivalent to logic "0" level through an output enable signal line $\overline{ENBL}$. The internal data bus system 34 is constituted by eight data signal lines IB0, IB1, . . . and IB7 propagating output data bits from the data source 32 to the output circuit 31. The external data bus system 35 is also implemented by eight data signal lines EB0, EB1, . . . and EB7, and the output circuit 31 relays the output data bits on the data signal lines IB0 to IB7 to the data signal lines EB0 to EB7. The data signal lines IB0 to IB7 and the data signal lines EB0 to EB7 serve as first data signal lines and second data signal lines, respectively.

The output circuit 31 has eight output units 31a, 31b, . . . and 31h; however, only three output units 31a, 31b and 31h are shown in FIG. 3 for the sake of simplicity. All of the output units 31a to 31h are similar in circuit arrangement to one another, and only the output unit 31a is hereinbelow described in detail. The component elements of the other output units 31b to 31h are designated by the same reference numerals assigned the corresponding component elements of the output unit 31a.

The output unit 31a comprises an output inverter circuit IV11 implemented by a series combination of a p-channel type field effect transistor QP11 and an n-channel type field effect transistor QN12 coupled between a source of positive voltage level Vdd and a ground node GND, and the associated data signal line EB0 is coupled to the common drain node of the field effect transistors QP11 and QN12. The output inverter circuit IV11 can provide a current path through one of the field effect transistors QP11 and QN12 to the data signal line EB0 depending upon the data bit on the associated data signal line IB0, and, for this reason, the output inverter circuit IV11 serves as a driving circuit. The output unit 31a further comprises a series combination of NOR gate NR11 and an inverter circuit IV13 coupled to the gate electrode of the p-channel type field effect transistor QP11, and a series combination of a NAND gate ND11 and an inverter circuit IV15 coupled to the gate electrode of the n-channel type field effect transistor QN12. The two series combinations thus provided in association with the output inverter circuit IV11 cause the field effect transistors QP11 and QN12 to complementarily turn on and off, and, therefore, as a whole constitute a controlling circuit.

The output circuit 31 further comprises a supervising circuit 31i, and the supervising circuit 31i has an inverter circuit IV16 associated with the output unit 31a and seven enabling units only two of which are shown and designated by reference marks EN1 and EN2, respectively. The inverter circuit IV16 is coupled to the output enable signal line $\overline{ENBL}$ for producing the complementary output enable signal, and the output enable signal line $\overline{ENBL}$ and the inverter circuit IV16 are used for activating the output unit 31a. In detail, the enabling signal line $\overline{ENBL}$ and the associated data signal line IB0 are respectively coupled to the two input nodes of the NOR gate NR11, and the inverter circuit IV16 and the data signal line IB0 are coupled to the two input nodes of the NAND gate ND11. Since the output enable signal of logic "0" level and the complementary enabling signal thereof activate the NOR gate NR11 and the NAND gate ND11, respectively, the output unit 31a becomes responsive to the output data bit on the associated data signal line IB0, and the p-channel type field effect transistor QP11 and the n-channel type field effect transistor QN12 of the output inverter circuit IV11 complementarily turn on and off to drive the associated data signal line EB0.

The seven enabling units are respectively provided for the other seven output units 31b to 31h, and the output units 31b is, by way of example, associated with the enabling unit EN1. All of the enabling units are similar in arrangement to one another, and the enabling unit EN1 comprises a two-input exclusive-OR gate EX1 coupled to the gate electrodes of the field effect transistors QP11 and QN12 of the output unit 31a and an inverter circuit IV17 coupled to the output node of the exclusive-OR gate EX1. The output node of the exclusive-OR gate EX1 is directly coupled to one of the input nodes of the NOR gate NR11 of the output unit 31b, and the inverter circuit IV17 is coupled to one of the input nodes of the NAND gate ND11 of the output unit 31b. The associated data signal line IB1 is coupled to the remaining nodes of the NOR gate NR11 and the NAND gate ND11 of the output unit 31b. While the enabling signal is in the inactive high voltage level equivalent to logic "1" level, the NOR gate NR11 and the NAND gate ND11 of the output unit 31a produce the output signal of the logic "0" level and the output signal of the logic "1" level which are relayed through the inverter circuits IV13 and IV15 to the gate electrodes of the field effect transistors QP11 and QN12, thereby causing the field effect transistors QP11 and QN12 to turn off. The output signals of the logic "0" level and the logic "1" level are supplied from the inverter circuits IV13 and IV15 to the exclusive-OR gate EX1, and the exclusive-OR gate EX1 yields the output signal of the logic "1" level, and the associated inverter circuit IV17 produces the output signal of the logic "0" level. With the output signal of the logic "1" level and the output signal of the logic "0" level, the NOR gate NR11 and the NAND gate ND11 remain inactive. This results in that the output unit 31b also remains in the inactive state. On the other hand, if the enabling signal goes down to the active low voltage level equivalent to the logic "0" level, the NOR gate NR11 and the NAND gate ND11 of the output unit 31a become responsive to the output data bit on the associated data signal line IB0, and output signals of the logic "1" level or the logic "0" level are concurrently supplied from the output nodes of the NOR and NAND gates NR11 and ND11 to the respective inverter circuits IV13 and IV15, and, further, to the gate electrodes of the field effect transistors QP11 and QN12 of the output unit 31a, respectively. The output signals of either logic "1" or "0" level cause the exclusive-OR gate EX1 to yield the output signal of the logic "0" level, and the inverter circuit IV17 supplies the output signal of the logic "1" level to the NAND gate ND11. Then, the NOR gate NR11 and the NAND gate ND11 become responsive to the output data bit on the associated data signal line IB1. The activation of the output unit 31b is detected by the enabling unit EN2 which causes the next output unit becomes responsive to the output data signal on the associated data signal line. Thus, the supervising circuit 31i sequentially activates the output units 31a to 31h, and a small amount of time delay is introduced between the data propagations of any two of the output units 31a to 31h. Such a ripple-like activation of the output units 31a to 31h prevents the source of positive voltage level Vdd or the ground node from undesirable voltage fluctuations, because the current does not concurrently rush into or from all of the data signal lines EB0 to EB7.

Description is hereinbelow made on the circuit behavior of the output circuit according to the present invention on the assumption that the data source 32 supplies the output data bits of (10 . . . 1) to the data signal lines IB0 to IB7.

While the output enable signal remains in the logic "1" level, the inverter circuit IV16 produces the complementary output enable signal of the logic "0" level, and the NOR gate NR11 and the NAND gate ND11 of the output unit 31a are in the inactive state producing the output signal of the logic "0" level and the output signal of the logic "1" level. The output signals of the NOR and NAND gates NR11 and ND11 are inverted and, then, supplied to the gate electrodes of the field effect transistors QP11 and QN12 of the output unit 31a. The field effect transistors QP11 and QN12 of the output unit 31a are simultaneously turned off, and the associated data signal line EB0 enters a high-state impedance state. The output signal of the logic "1" level and the output signal of the logic "0" level are further supplied to the exclusive-OR gate EX1, and the exclusive-OR gate EX1 yields the output signal of the logic "1" level. Then, the exclusive-OR gate EX1 and the inverter circuit IV17 cause the NOR gate NR11 and the NAND gate ND11 of the output unit 31b to enter the inactive state, and the output inverter circuit IV11 of the output unit 31b shifts the associated data signal line EB1 into the high-impedance state. The other enabling units also cause the associated output units to shift the associated data signal lines into the high-impedance state, and no data bit is transferred to the external data bus system 35.

Figure 4:
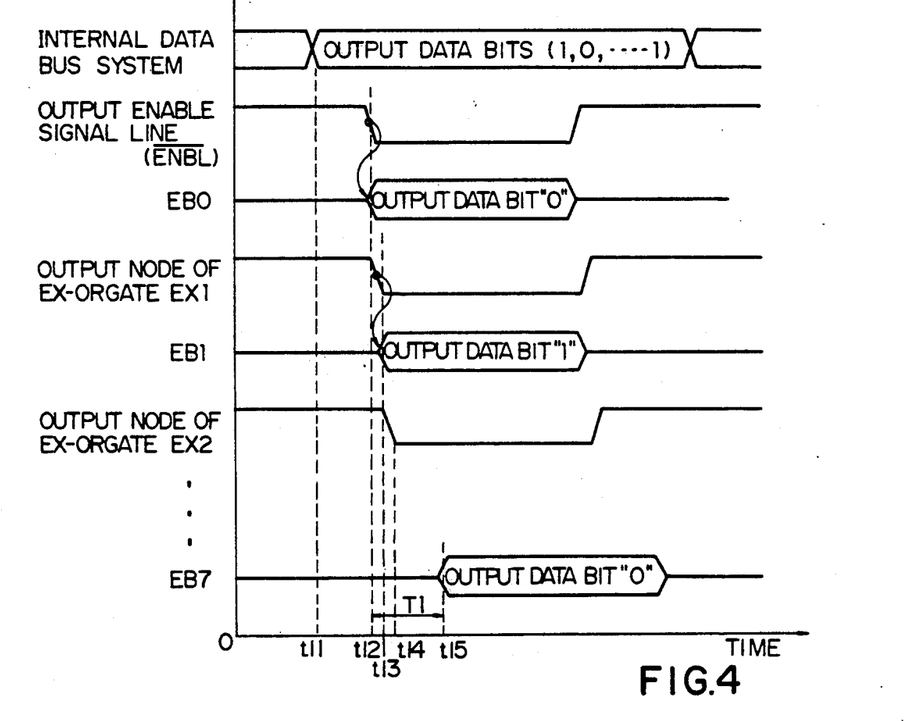
FIG. 4 is a timing chart showing the circuit behavior of the output circuit of the present invention shown in FIG. 3.

The data source 32 supplies the output data bits (10 . . . 1) to the internal data bus system 34 at time t11 as shown in FIG. 4, but the output units 31a to 31h are never responsive to the output data bits, because the output enabling signal still remains the inactive logic "1" level. However, if the output enable signal goes down to the active logic "0" level at time t12, the output enable signal $\overline{ENBL}$ and the inverter circuit IV16 allow the NOR gate NR11 and the NAND gate ND11 of the output unit 31a to concurrently enter the active state, but the other output units 31b to 31h still remains in the inactive state. The NOR gate NR11 and the NAND gate ND11 thus activated produce the output signals of the logic "0" level which are relayed to the gate electrodes of the field effect transistors QP11 and QN12 through the inverter circuits IV13 and IV15. With the output signals of the logic "1" level fed from the inverter circuits IV13 and IV15, only the n-channel type field effect transistor QN12 turns on so as to provide a current path from the source of ground voltage level GND to the associated data signal line EB0. Then, the associated data signal line EB0 is driven to the ground voltage level GND equivalent to the logic "0" level. The output signals of the logic "1" level is further supplied from the inverter circuits IV13 and IV15 to the exclusive-OR gate EX1, and the output signal of the logic "0" takes place at the output node of the exclusive-OR gate EX1 at time t13. The exclusive-OR gate EX1 and the associated inverter circuit IV17 allow the NOR gate NR11 and the NAND gate ND11 of the output unit 31b to enter the active state, and the NOR gate NR11 and the NAND gate ND11 of the output unit 31b produce the output signals of the logic "1" level. The output signals of the logic "1" level thus produced are fed from the NOR gate NR11 and the NAND gate ND11 through the inverter circuits IV13 and IV15 to the gate electrodes of the field effect transistors QP11 and QN12 of the output unit 31b, and only the p-channel type field effect transistor QP11 turns on to provide a current path from the source of positive voltage level Vdd to the associated data signal line EB1. Then, the associated data signal line EB1 is charged through the current path in the p-channel type field effect transistor QP11, and the output data bit of the logic "1" level takes place on the data signal line EB1. Thus, a small amount of time delay is introduced between the production of the data bit "0" on the data signal line EB0 and the production of the data bit "1" on the data signal line EB1, and, for this reason, the amount of current fed from the source of positive voltage level Vdd is smaller than that in the prior art output circuit.

The output signals of the logic "0" level are further supplied to the exclusive-OR gate EX2 associated with the subsequent output unit, and the exclusive-OR gate EX2 Yields the output signal of the logic "0" level at time t14. Thus, the enabling units sequentially allow the associated output circuits 31b to 31h to enter the active state, and, for this reason, the output data bits (01 ... 0) take place on the data signal lines EB0 to EB7 at intervals. In other words, the output data bits are transferred to the data signal lines EB0 to EB7 in a ripple manner, and the most significant data bit "0" transferred to the associated data signal line EB7 at time t15.

As will be understood from the foregoing description, the output data bits are sequentially transferred from the internal data bus system 34 to the external data bus system 35, and a small amount of current flows from the source of positive voltage level Vdd over a time period T1 from time t12 to time t15. The small amount of current is an eighth of the current of the prior art output circuit and is, therefore, less causative of undesirable voltage fluctuations. For this reason, the integrated circuit is free from any error made in the production of the output data bits.

Second Embodiment

Figure 5:
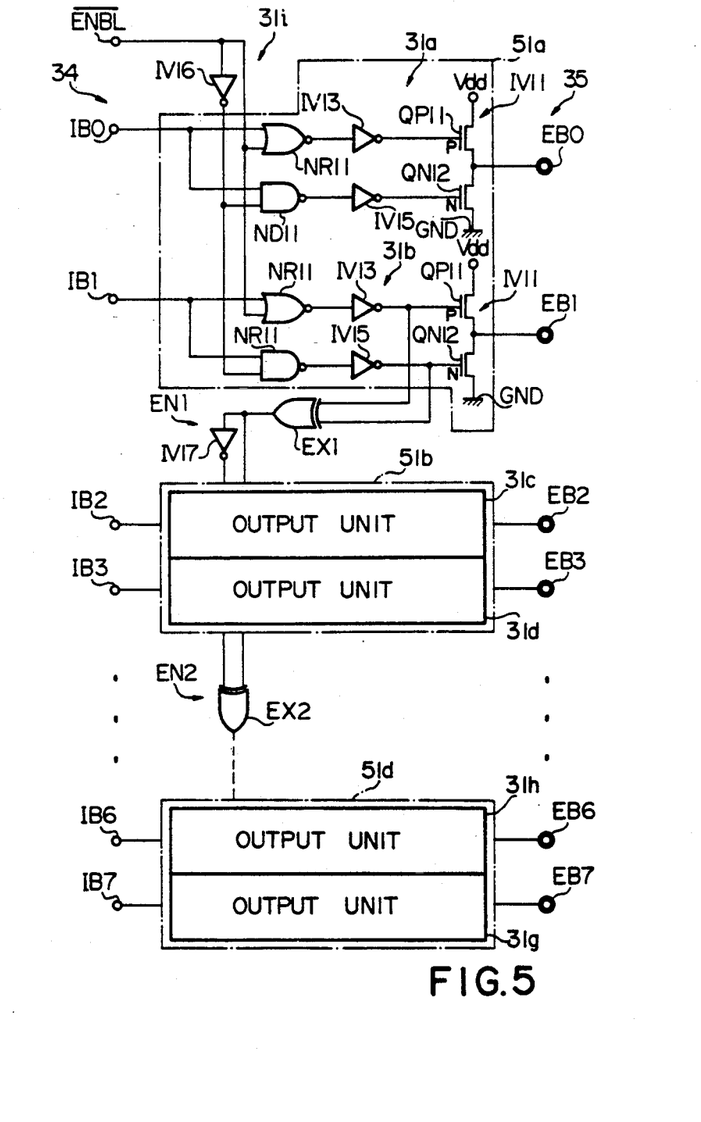
FIG. 5 is a circuit diagram showing the circuit arrangement of another output circuit according to the present invention.

Turning to FIG. 5 of the drawings, another output circuit embodying the present invention is illustrated. The component circuits and units of the output circuit illustrated in FIG. 5 are similar to those shown in FIG. 3, and, for this reason, the corresponding circuits and units are designated by the same reference numerals and marks without any detailed description.

Every two output units 31a, 31b, 31c, 31d, . . . , 31f and 31h are grouped into output groups 51a, 51b, and 51d, and the data transferring operation are concurrently carried out on every two data bits. In other words, the supervising circuit 31i allows every two output units or one of the output groups 51a to 51d to concurrently enter the active state.

While the output enabling signal $\overline{ENBL}$ remains in the inactive logic "1" level, any NOR gate NR11 and any NAND gate ND11 incorporated in the output group 51a is not responsive to the output data bits on the data signal lines IB0 and IB1, and, therefore, other NOR gates and other NAND gates remain in the inactive state.

Figure 6:
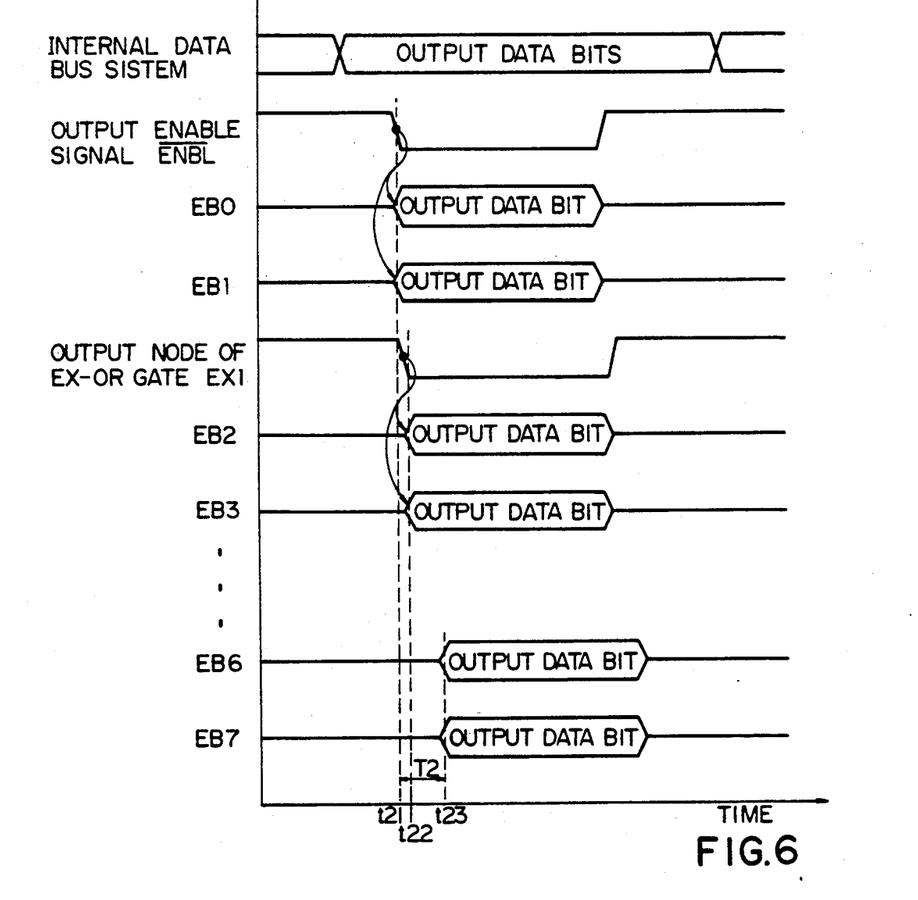
FIG. 6 is a timing chart showing the circuit behavior of the output circuit shown in FIG. 5.

If output data bits are supplied to the data signal lines IB0 to IB7 and, then, the output enable signal goes down to the active logic "0" level at time t21 as shown in FIG. 6, and the output enable signal line $\overline{ENBL}$ and the inverter circuit IV16 allow the NOR gates NR11 and the NAND gates ND11 of the output group 51a to concurrently enter the active state. The two combinations of the NOR gates NR11 and the NAND gates ND11 produce two sets of the output signals depending upon the output data bits on the associated data signal lines IB0 and IB1, respectively, and the output inverter circuits IV11 drive the associated data signal lines EB0 and EB1 in response to the output signals fed from the NOR and NAND gates NR11 and ND11. The output signals fed from the NOR and NAND gates NR11 and ND11 incorporated in the output unit 31b are further supplied through the inverter circuits IN13 and IV15 to the exclusive-OR gate EX1 and allow the exclusive-OR gate EX1 to shift the output signal thereof to the logic "0" level at time t22. The exclusive-OR gate EX1 and the associated inverter circuit IV17 cause the NOR gates and the NAND gates incorporated in the output group 51b or the output units 31c and 31d to enter the active-state as similar to the output enable signal line $\overline{ENBL}$ and the inverter circuit IV16. Then, the output units 31c and 31d become responsive to the output data bits on the data signal lines IB3 and IB4, respectively, and the data bits are transferred to the data signal lines EB3 and EB4, respectively. Thus, the exclusive-OR gates respectively associated with the inverter circuits allow the output groups 51b to 51d to sequentially enter the active-state, and the data bits on the data signal lines IB6 and IB7 are finally transferred to the associated data signal lines EB6 and EB7 at time t23.

Since every two output units concurrently become responsive to the output data bits on the data signal lines of the internal data bus system 34, the time interval T2 is shorter than the time interval T1, but a larger amount of current flows from the source of positive voltage level Vdd rather than the first embodiment.

Third Embodiment

Figure 7:
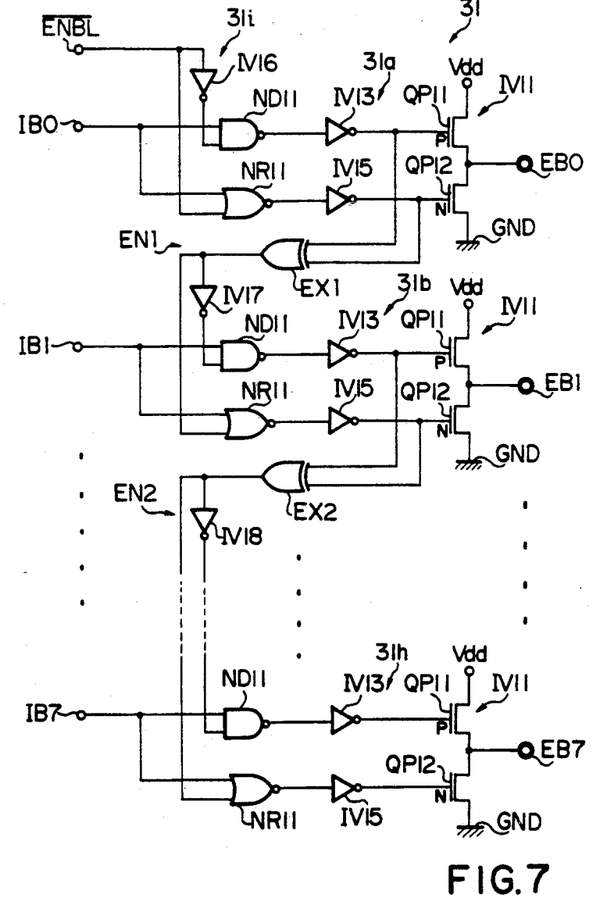
FIG. 7 is a circuit diagram showing the circuit arrangement of still another output circuit according to the present invention.

Turning to FIG. 7 of the drawings, still another output circuit embodying the present invention is illustrated. All of the component circuits and units are similar to those of the first embodiment except for arrangement, and the corresponding circuits and units are designated by the same reference numerals and marks used in FIG. 3.

The p-channel type field effect transistor QP11 and the n-channel type field effect transistor QN12 of the output inverter circuit IV11 are coupled to the first series combination of the NAND gate ND11 and the inverter circuit IV13 and the second series combination of the NOR gate NR11 and the inverter circuit IV15, respectively. Thus, the NOR gate NR11 and the NAND gate ND11 are replaced with each other. However, the output enable signal line $\overline{ENBL}$ and the exclusive-OR gates EX1 and EX2 are directly coupled to the NOR gates NR11, respectively, and the associated inverter circuits IV16, IV17 and IV18 are connected to the respective NAND gates ND11, respectively.

The circuit behavior of the output circuit shown in FIG. 7 is similar to that of the first embodiment, and no description is incorporated hereinbelow.

Fourth Embodiment

Figure 8:
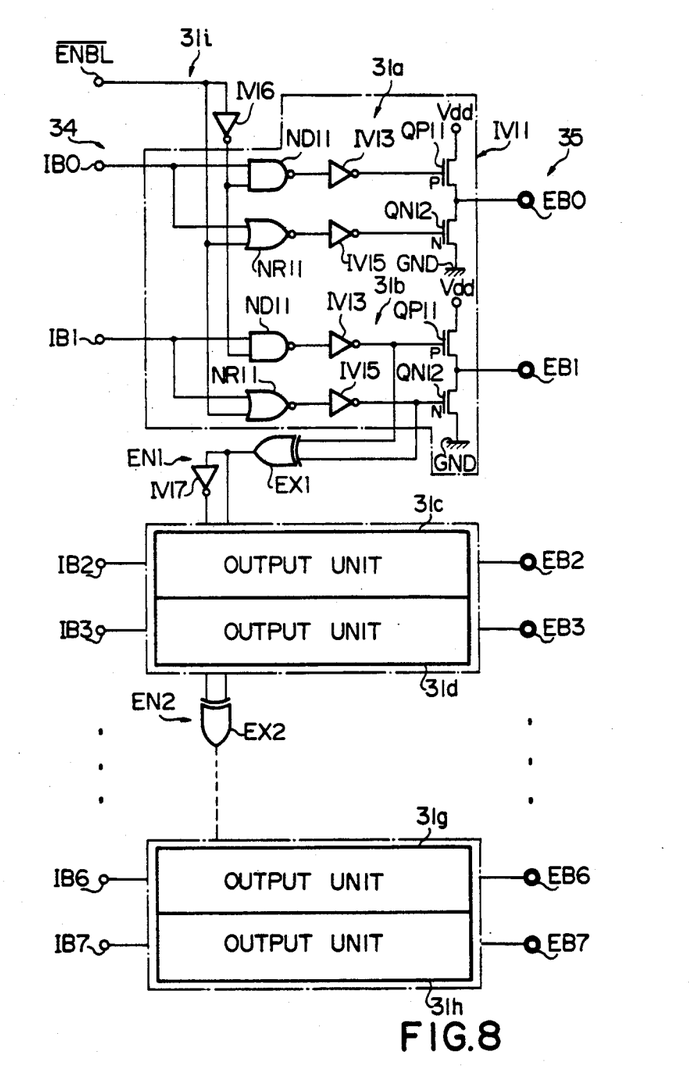
FIG. 8 is a circuit diagram showing the circuit arrangement of still another output circuit according to the present invention.

Using the output units 31a to 31h where the NOR gate NR11 and the NAND gate ND11 are replaced with each other, still another output circuit is formed as shown in FIG. 8. The output circuit shown in FIG. 8 allows every two output units 31a to 31h to concurrently enter the active state as similar to the second embodiment. The fourth embodiment is faster than the third embodiment and slightly increased in the amount of current fed from the source of positive voltage level Vdd.

Although particular embodiments of the present invention have been shown and described, it will be obvious to those skilled in the art that various changes and modifications may be made without departing from the spirit and scope of the present invention. For example, more than two output units may concurrently become responsive to data bits on the associated data signal lines of the internal data bus system.

What is claimed is:

1. An output circuit comprising
 a) a plurality of output units coupled between first data signal lines and second data signal lines, respectively, each of said output units comprising:
  a-1) a driving circuit operative to drive said associated second data signal line by providing a current path between said associated second data signal line and one of first and second sources of voltage level; and
  a-2) a controlling circuit responsive to an output data signal on said associated first data signal line and allowing said driving circuit to drive said associated second data line; and, in which said output circuit further comprises:
 b) a supervising circuit responsive to an output enable signal and causing the controlling circuit incorporated in one of said output units to allow the driving circuit incorporated in said one of said output units to drive said associated second data signal line after the controlling circuit incorporated in another output unit allows the driving circuit incorporated in said another output unit to drive the associated second data signal line, thereby introducing time delay between driving operations on said second data signal lines.

2. An output circuit as set forth in claim 1, in which said driving circuit is implemented by a first series combination of a first field effect transistor of one channel conductivity type and a second field effect transistor of the opposite channel conductivity type coupled between said first and second sources of voltage level, said first and second field effect transistors being gated by said controlling circuit.

3. An output circuit as set forth in claim 2, in which said controlling circuit has a second series combination of a NOR gate and a first inverter circuit coupled to the gate electrode of said first field effect transistor, and a third series combination of a NAND gate and a second inverter circuit coupled to the gate electrode of said second field effect transistor, said NOR gate and said NAND gate selectively simultaneously entering an active state and an inactive state, said associated first data signal line being coupled to first input nodes of said NOR gate and said NAND gate, said supervising circuit being coupled to the second input nodes of said NOR gate and said NAND gate.

4. An output circuit as set forth in claim 3, in which said supervising circuit comprises a third inverter circuit supplied with said output enable signal so as to produce the complementary output enable signal, said output enable signal and the complementary output enable signal being respectively supplied to the second input nodes of said NOR gate and said NAND gate of one of said output units.

5. An output circuit comprising
 a) a plurality of output units coupled between first data signal lines and second data signal lines, respectively, each of said output units comprising:
  a-1) a driving circuit operative to drive said associated second data signal line by providing a current path between said associated second data signal line and one of first and second sources of voltage level; and
  b-2) a controlling circuit responsive to an output data signal on said associated first data signal line and allowing said driving circuit to drive said associated second data line, in which said output circuit further comprises
 b) a supervising circuit responsive to an output enable signal and causing the controlling circuit incorporated in one of said output units to allow the driving circuit incorporated in said one of said output units to drive said associated second data signal line after the controlling circuit incorporated in another output unit allows the driving circuit incorporated in said another output unit to drive the associated second data signal line, thereby introducing time delay between driving operations on said second data signal lines, said driving circuit being implemented by a first series combination of a first field effect transistor of one channel conductivity type and a second field effect transistor of the opposite channel conductivity type coupled between said first and second sources of voltage level, said first and second field effect transistors being gated by said controlling circuit, said controlling circuit having a second series combination of a NOR gate and a first inverter circuit coupled to the gate electrode of said first field effect transistor, and a third series combination of a NAND gate and a second inverter circuit coupled to the gate electrode of said second field effect transistor, said NOR gate and said NAND gate selectively simultaneously entering an active state and an inactive state, said associated first date signal line being coupled to first input nodes of said NOR gate and said NAND gate, said supervising circuit being coupled to the second input nodes of said NOR gate and said NAND gate, said supervising circuit comprising a third inverter circuit supplied with said output enable signal so as to produce the complementary output enable signal, said output enable signal and the complementary output enable signal being respectively supplied to the second input nodes of said NOR gate and said NAND gate of one of said output units, said supervising circuit further comprising enabling units respectively associated with the other output units, each of said enabling units being operative to detect said active state of said NOR gate and said NAND gate of another output unit for causing said NOR gate and said NAND gate of said associated output unit to enter said active state.

6. An output circuit comprising:
 a) a plurality of output units coupled between first data signal lines and second data signal lines, respectively, each of said output units comprising:
  a-1) a driving circuit operative to drive said associated second data signal line by providing a current path between said associated second data signal line and one of first and second sources of voltage level, and a-2) a controlling circuit responsive to an output data signal on said associated first data signal line and allowing said driving circuit to drive said associated second data line, in which said output circuit further comprises:

b) a supervising circuit responsive to an output enable signal and causing the controlling circuit incorporated in one of said output units to allow the driving circuit incorporated in said one of said output units to drive said associated second data signal line when the controlling circuit incorporated in said one of said output units to drive said associated second data signal line when the controlling circuit incorporated in another output unit allows the driving circuit incorporated in said another output unit to drive the associated second data signal line, said driving circuit being implemented by a first series combination of a first field effect transistor of one channel conductivity type and a second field effect transistor of the opposite channel conductivity type coupled between said first and second sources of voltage level, said first and second field effect transistors being gated by said controlling circuit, said controlling circuit having a second series combination of a NOR gate and a first invertor circuit coupled to the gate electrode of said first field effect transistor, and a third series combination of a NAND gate and a second invertor circuit coupled to the gate electrode of said second field effect transistor, said NOR gate and said NAND gate selectively simultaneously entering an active state and an inactive state, said associated first data signal line being coupled to first input nodes of said NOR gate and said NAND gate, said supervising circuit being coupled to the second input nodes of said NOR gate and said NAND gate, said supervising circuit comprising a third invertor circuit supplied with said output enable signal so as to produce the complementary output enable signal, said output enable signal and the complementary output enable signal being respectively supplied to the second input nodes of said NOR gate and said NAND gate of one of said output units, said supervising circuit further comprising enabling units respectively associated with the other output units, and in which each of said enabling units is operative to detect said active state of said NOR gate and said NAND gate of another output unit for causing said NOR gate and said NAND gate of said associated output unit to enter said active state, each of said enabling units having an exclusive-OR gate coupled at the input nodes thereof to the gate electrodes of said first and second field effect transistors and a fourth invertor circuit coupled to the output node of said exclusive-OR gate, the output node of said exclusive-OR gate being coupled to the second input node of said NOR gate of said associated output unit, the output node of said fourth invertor circuit being coupled to the second input node of said NAND gate of said associated output unit.

7. An output circuit as set forth in claim 3, in which said plurality of output units are divided into a plurality of output groups each having at least two output units.

8. An output circuit as set forth in claim 7, in which said supervising circuit comprises a third inverter circuit supplied with said output enable signal so as to produce the complementary output enable signal, said output enable signal being supplied to the second input nodes of said NOR gates incorporated in one of said output group, said complementary output enable signal being supplied to the second input nodes of said NAND gates incorporated in said one of said output groups.

9. An output circuit comprising a) a plurality of output units coupled between first data signal lines and second data signal lines, respectively, each of said output units comprising:

a-1) a driving circuit operative to drive said associated second data signal line by providing a current path between said associated second data signal line and one of first and second sources of voltage level; and a-2) a controlling circuit responsive to an output data signal on said associated first data signal line and allowing said driving circuit to drive said associated second data line; in which said output circuit further comprises b) a supervising circuit responsive to an output enable signal and causing the controlling circuit incorporated in one of said output units to allow the driving circuit incorporated in said one of said output units to drive said associated second data signal line after the controlling circuit incorporated in another output unit allows the driving circuit incorporated in said another output unit to drive the associated second data signal line, thereby introducing time delay between driving operations on said second data signal lines, said driving circuit being implemented by a first series combination of a first field effect transistor of one channel conductivity type and a second field effect transistor of the opposite channel conductivity type coupled between said first and second sources of voltage level, said first and second field effect transistors being gated by said controlling circuit, said controlling circuit having a second series combination of a NOR gate and a first inverter circuit coupled to the gate electrode of said first field effect transistor, and a third series combination of a NAND gate and a second inverter circuit coupled to the gate electrode of said second field effect transistor, said NOR gate and said NAND gate selectively simultaneously entering an active state and an inactive state, said associated first data signal line being coupled to first input nodes of said NOR gate and said NAND gate, said supervising circuit being coupled to the second input nodes of said NOR gate and said NAND gate, said plurality of output units being divided into a plurality of output groups each having at least two output units, said supervising circuit comprising a third inverter circuit supplied with said output enable signal so as to produce the complementary output enable signal, said output enable signal being supplied to the second input nodes of said NOR gates incorporated in one of said output group, said complementary output enable signal being supplied to the second input nodes of said NAND gates incorporated in said one of said output groups, said supervising circuit further comprising enabling units respectively associated with the other output groups, each of said enabling units being operative to detect said active state of said NOR gate and said NAND gate of another output group for causing said NOR gates and said NAND gates incorporated in said associated output group to enter said active state.

10. An output circuit comprising:
a) a plurality of output units coupled between first data signal lines and second data signal lines, respectively, each of said output units comprising:
   a-1) a driving circuit operative to drive said associated second data signal line by providing a current path between said associated second data signal line and one of first and second sources of voltage level, and
   a-2) a controlling circuit responsive to an output data signal on said associated first data signal line and allowing said driving circuit to drive said associated second data line, in which said output circuit further comprises:
b) a supervising circuit responsive to an output enable signal and causing the controlling circuit incorporated in one of said output units to allow the driving circuit incorporated in said one of said output units to drive said associated second data signal line when the controlling circuit incorporated in another output unit allows the driving circuit incorporated in said another output unit to drive the associated second data signal line, said driving circuit being implemented by a first series combination of a first field effect transistor of one channel conductivity type and a second field effect transistor of the opposite channel conductivity type coupled between said first and second sources of voltage level, said first and second field effect transistors being gated by said controlling circuits said controlling circuit having a second series combination of a NOR gate and a first invertor circuit coupled to the gate electrode of said first field effect transistor, and a third series combination of a NAND gate and a second invertor circuit coupled to the gate electrode of said second field effect transistor, said NOR gate and said NAND gate selectively simultaneously entering an active state and an inactive state, said associated first data signal line being coupled to first input nodes of said NOR gate and said NAND gate, said supervising circuit being coupled to the second input nodes of said NOR gate and said NAND gate, said plurality of output units being divided into a plurality of output groups each having at least two output units, said supervising circuit comprising a third invertor circuit supplied with said output enable signal so as to produce the complementary output enable signal, said output enable signal being supplied to the second input nodes of said NOR gates incorporated in one of said output groups, said complementary output enable signal being supplied to the second input nodes of said NAND gates incorporated in said one of said output groups, said supervising circuit further comprising enabling units respectively associated with the other output groups, and in which each of said enabling units is operative to detect said active state of said NOR gate and said NAND gate of another output group for causing said NOR gates and said NAND gates incorporated in said associated output group to enter said active state, each of said enabling units having an exclusive-OR gate coupled at the input nodes thereof to the gate electrodes of said first and second field affect transistors of said output invertor circuit incorporated in said another output group, and a fourth invertor circuit coupled to the output node of said exclusive-OR gate, the output nods of said exclusive-OR gate being coupled to the second input nodes of said NOR gates incorporated in said associated output group, the output node of said fourth invertor circuit being coupled to the second input nodes of said NAND gates incorporated in said associated output group.

11. An output circuit comprising:
a) a plurality of output units respectively coupled between first output data signal lines and second output data signal lines and including first and second output units, each of said first and second output units having
   a-1) a driving circuit operative to drive said associated second output data signal line by providing a current path between said associated second output data signal line and one of first and second sources of voltage level, and
   a-2) a controlling circuit responsive to an output data signal on said associated first output data signal line and allowing said driving circuit to drive said associated second output data signal line; and
b) a supervising circuit responsive to an output enable signal for causing said controlling circuit incorporated in said first output unit to allow said driving circuit incorporated in said first output unit to drive said associated second output data signal line, said supervising circuit being further operative to cause said controlling circuit incorporated in said second output unit to allow said driving circuit incorporated in said second output unit to drive said associated second output data signal line after said controlling circuit incorporated in said first output unit allows said driving circuit incorporated in said first output unit to drive said associated second output data signal line.

12. An output circuit comprising a plurality of output units each comprising a) a driving circuit, b) means responsive to an output data signal and an output enable signal and operative to supply said output data signal to said driving circuit in the presence of said output enable signal of an active level, and c) means for producing a detecting signal indicative of an active state of said driving circuit, in which a previous stage of said output units supplies said detecting signal serving as said output enable signal to a next stage of said driving circuit.

13. An output circuit comprising
a) a plurality of output units coupled between first data signal lines and second data signal lines, respectively, each of said output units comprising
   a-1) a driving circuit implemented by a series combination of a first field effect transistor of one channel conductivity type and a second field effect transistor of the opposite channel conductivity type coupled between first and second sources of voltage level and operative to drive said associated second data signal line by providing a current path between said associated second data signal line and one of said first and second sources of voltage level, and
   a-2) a controlling circuit implemented by a first series combination of a NAND gate and a first inverter circuit and a second series combination of a NOR gate and a second inverter circuit and responsive to an output data signal on said associated first data signal line for allowing said driving circuit to drive said associated second data line, said first and second series combinations being coupled to the gate electrodes of said first and second field effect transistors, respectively, said output units being divided into a plurality of output groups, in which said output circuit further comprises b) a supervising circuit responsive to an output enable signal of active low voltage level and causing the controlling circuits incorporated in one of said output groups to allow the driving circuits incorporated in said one of said output groups to drive said associated second data signal lines when the controlling circuit incorporated in another output group allows the driving circuit incorporated in said another output unit to drive the associated second data signal line, and in which said supervising circuit comprises a third inverter circuit supplied with said output enable signal so as to produce the complementary output enable signal, said output enable signal being supplied to the second input nodes of said NOR gates incorporated in one of said output groups, said complementary output enable signal being supplied to the second input nodes of said NAND gates incorporated in said one of said output groups, wherein said supervising circuit further comprises enabling units respectively associated with the other output groups, each of said enabling units being operative to detect said active state of said NAND gate and said NOR gate of another output group for causing said NAND gates and said NOR gates incorporated in said associated output group to enter said active state, each of said enabling units having an exclusive-OR gate coupled at the input nodes thereof to the gate electrodes of said first and second field effect transistors of said output inverter circuit incorporated in said another output group, and a fourth inverter circuit coupled to the output node of said exclusive-OR gate, the output node of said exclusive-OR gate being coupled to the second input nodes of said NOR gates incorporated in said associated output group, the output node of said fourth inverter circuit being coupled to the second input nodes of said NAND gates incorporated in said associated output group.

* * * * *

UNITED STATES PATENT AND TRADEMARK OFFICE
CERTIFICATE OF CORRECTION

PATENT NO. : 5,194,763
DATED : March 16, 1993
INVENTOR(S) : Suzuki

It is certified that error appears in the above-indentified patent and that said Letters Patent is hereby corrected as shown below:

Col. 2, line 12, delete "sill" insert --will--.

Col. 10, line 9, delete "b-2" insert --a-2--;

Col. 10, line 40, delete "date" insert --data--.

Col. 13, line 65, delete "affect" insert --effect--.

Col. 14, line 1, delete "nods" insert --nodes--;

Col. 14, line 46, delete "circuit" insert --units--.

Signed and Sealed this

Twenty-eighth Day of December, 1993

Attest:

BRUCE LEHMAN

*Attesting Officer*     *Commissioner of Patents and Trademarks*